US005668452A

United States Patent [19]

Villarreal et al.

[11] Patent Number: 5,668,452
[45] Date of Patent: Sep. 16, 1997

[54] MAGNETIC SENSING ROBOTICS FOR AUTOMATED SEMICONDUCTOR WAFER PROCESSING SYSTEMS

[75] Inventors: Danine Villarreal, San Antonio; Anthony Sayka, Austin, both of Tex.

[73] Assignee: VLSI Technology, Inc., San Jose, Calif.

[21] Appl. No.: 644,115

[22] Filed: May 9, 1996

[51] Int. Cl.$^6$ .............................. B25J 5/00; F26B 17/24
[52] U.S. Cl. .................. 318/568.16; 318/568.1; 318/568.12; 414/730; 414/217; 414/938; 34/58
[58] Field of Search ..................... 318/560–596; 901/3, 8, 10, 16; 414/217, 940, 941, 222, 416, 225; 34/58; 395/80–88; 250/223 R, 559.4, 548, 559.09; 356/400

[56] References Cited

U.S. PATENT DOCUMENTS

| | | | |
|---|---|---|---|
| 4,096,925 | 6/1978 | Koob et al. . | |
| 4,532,869 | 8/1985 | Kondo et al. | 104/166 |
| 4,698,775 | 10/1987 | Koch et al. . | |
| 4,813,732 | 3/1989 | Klem . | |
| 4,816,732 | 3/1989 | Wilson . | |
| 4,890,241 | 12/1989 | Hoffman et al. | 901/8 |
| 5,003,188 | 3/1991 | Igari | 414/274 |
| 5,044,752 | 9/1991 | Thurfjell et al. | 414/416 |
| 5,171,393 | 12/1992 | Moffat . | |
| 5,219,264 | 6/1993 | McClure et al. | 414/730 |
| 5,225,691 | 7/1993 | Powers et al. | 414/331 |
| 5,266,812 | 11/1993 | Mokuo | 414/938 |
| 5,319,216 | 6/1994 | Mokuo et al. | 414/938 |
| 5,398,437 | 3/1995 | Bump, Jr. et al. . | |
| 5,407,449 | 4/1995 | Zinger | 29/25.01 |
| 5,411,358 | 5/1995 | Garric et al. . | |
| 5,451,289 | 9/1995 | Barbee et al. | 216/59 |
| 5,486,080 | 1/1996 | Sieradzki | 414/217 |
| 5,544,421 | 8/1996 | Thompson et al. | 414/938 |
| 5,570,770 | 11/1996 | Baaten et al. | 192/147 |

FOREIGN PATENT DOCUMENTS 3814582  4/1988  Germany .

*Primary Examiner*—Paul Ip
*Attorney, Agent, or Firm*—Majestic, Parsons, Siebert & Hsue

[57] ABSTRACT

A collision avoidance technique is provided in an automated semiconductor wafer processing system, wherein a magnet or magnetic strip is incorporated into each boat or carrier used to hold and transport the semiconductor wafers during the IC fabrication process. Additionally, a magnetic field sensing device is incorporated into the robotic arm of the system for sensing the presence of magnetic fields generated by the magnet(s) incorporated into the boats and/or carriers. Using this system, it is possible for the automated system controller to determine whether an imminent collision is about to occur by monitoring changes in the detected magnetic field. In this way, collisions between one boat/carrier and a second boat/carrier may be anticipated and avoided without relying upon physical contact between the two objects in order to detect collision.

16 Claims, 8 Drawing Sheets

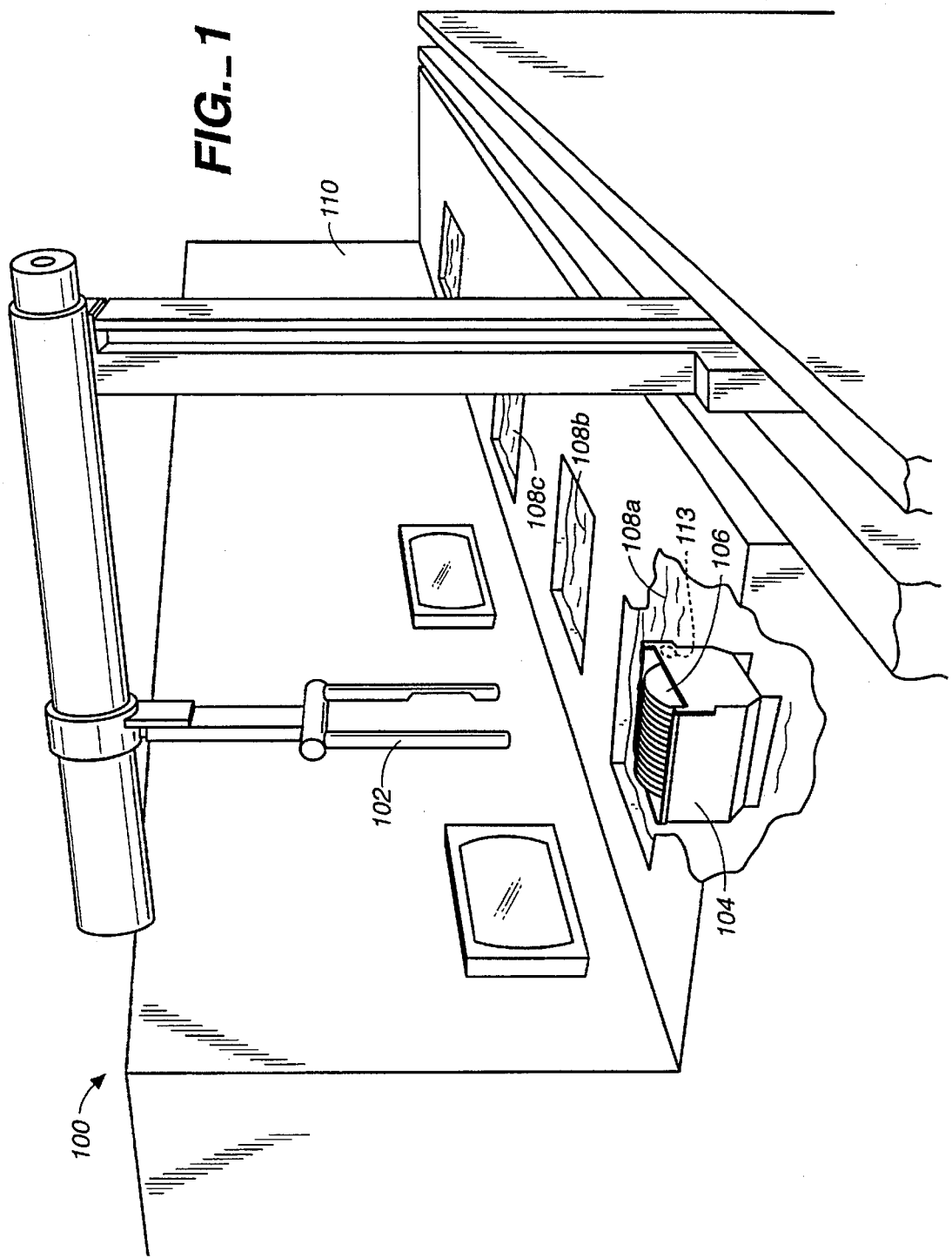
FIG._1

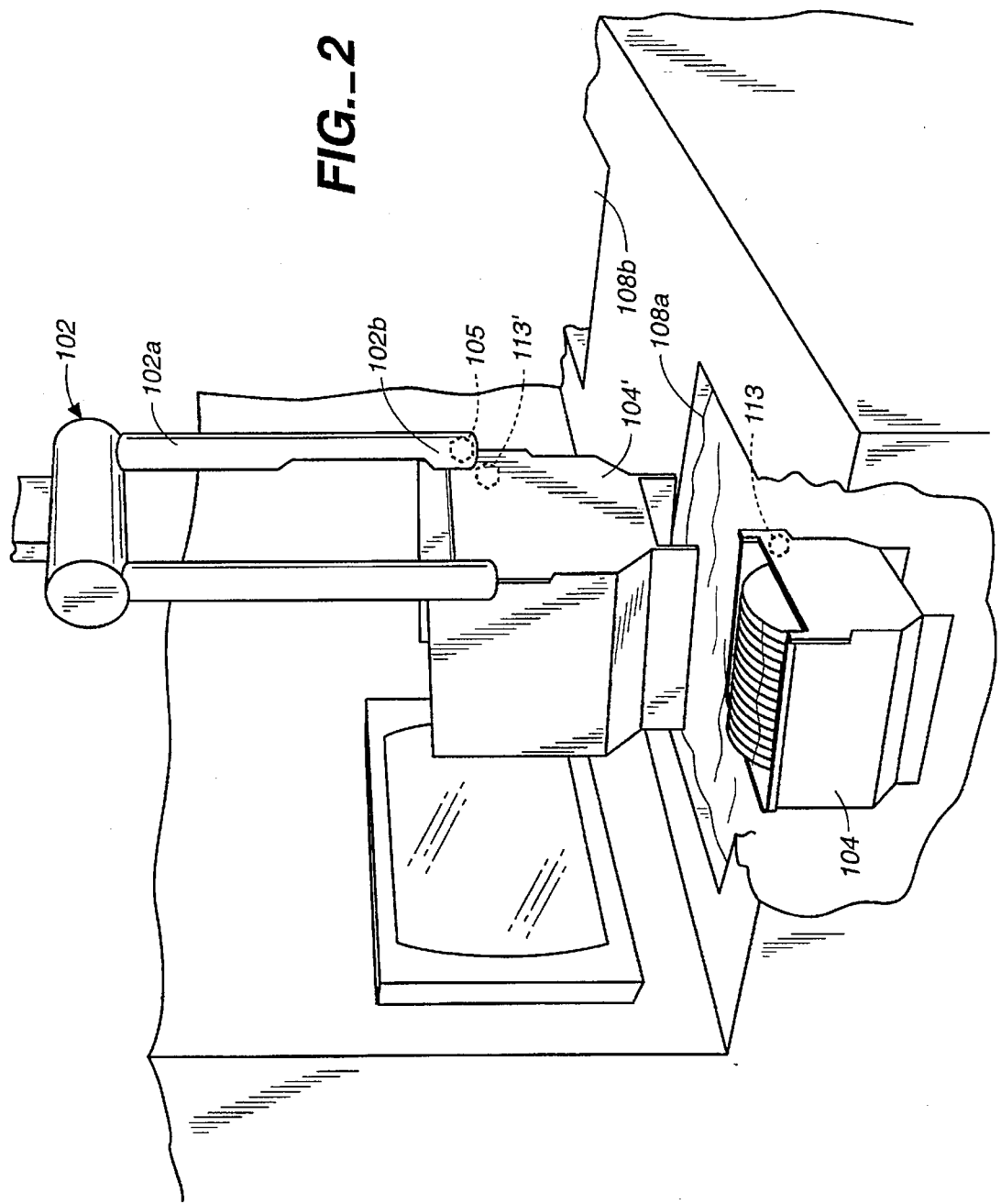
FIG._2

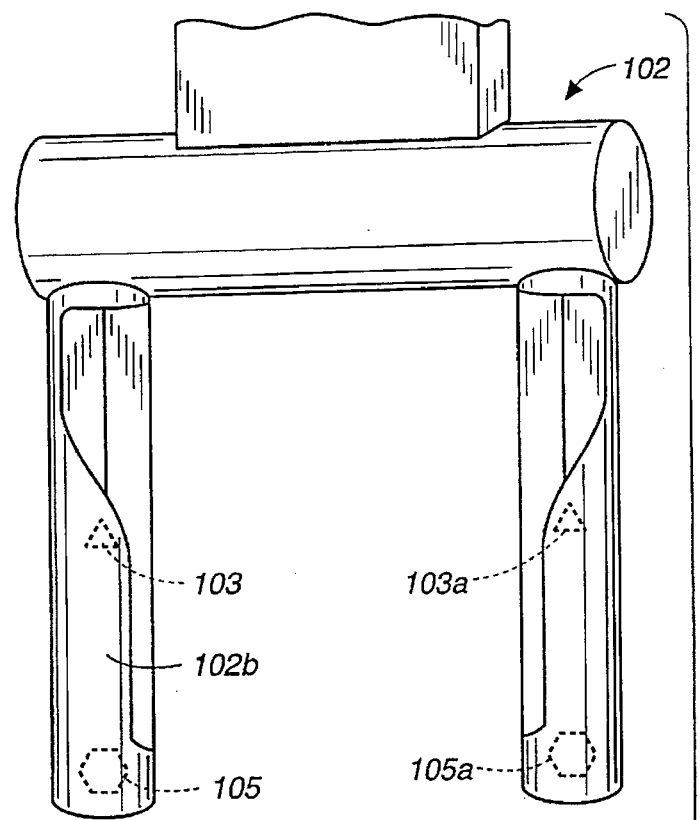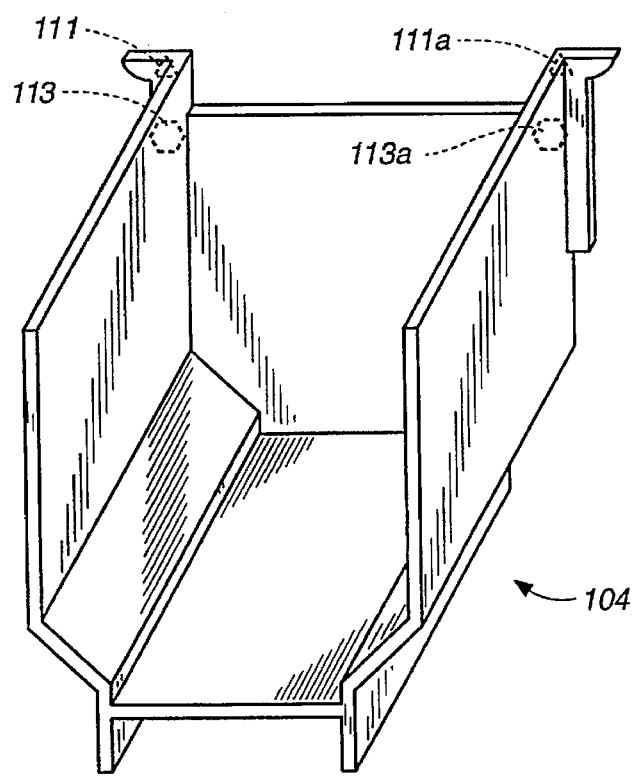
FIG._3

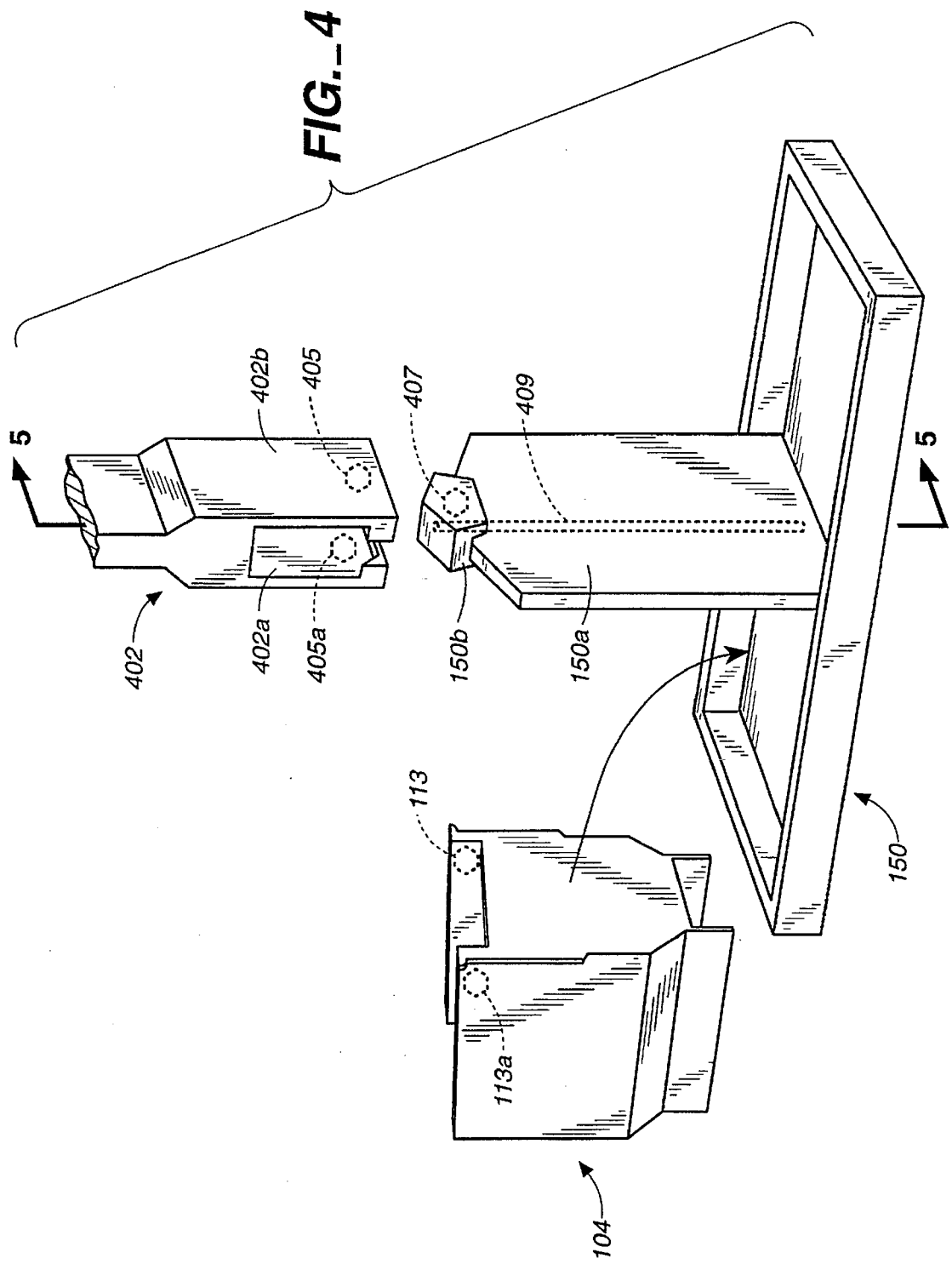

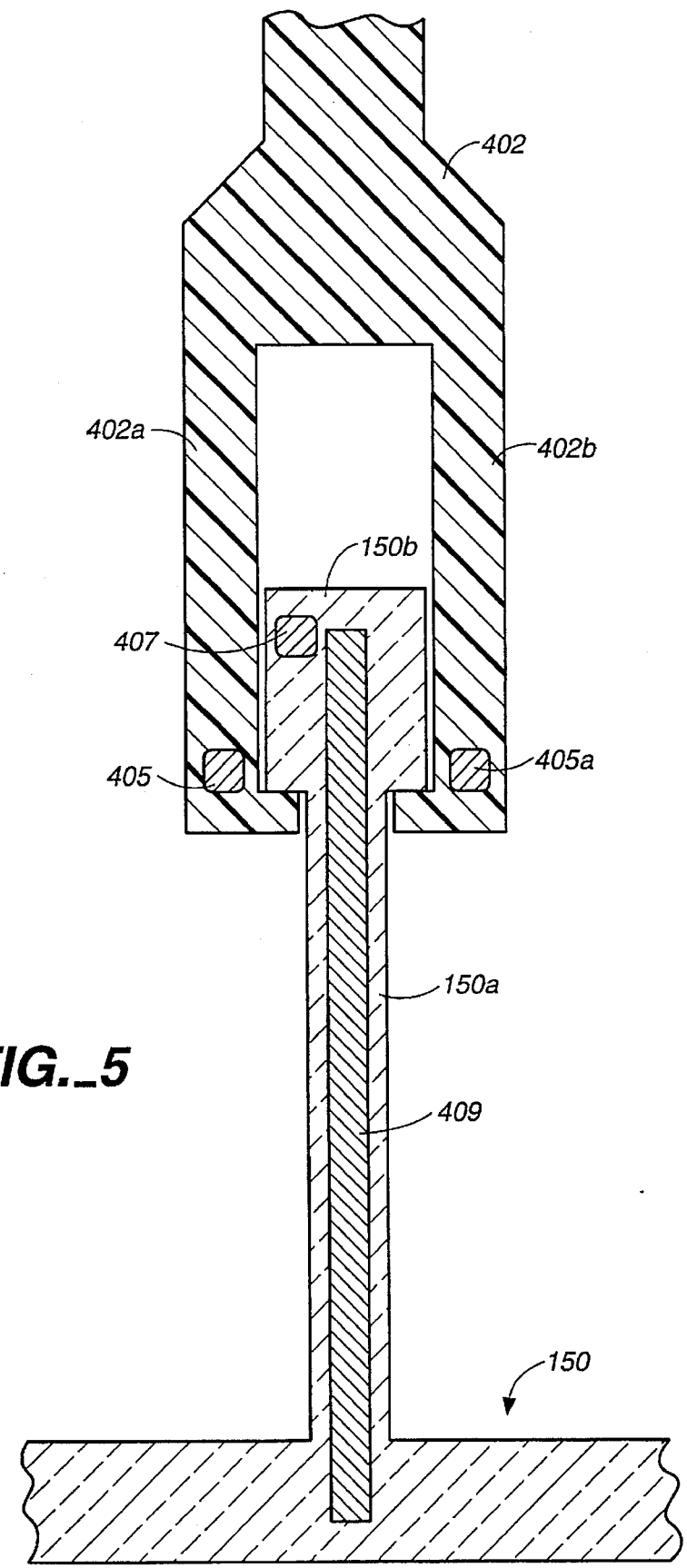
FIG._5

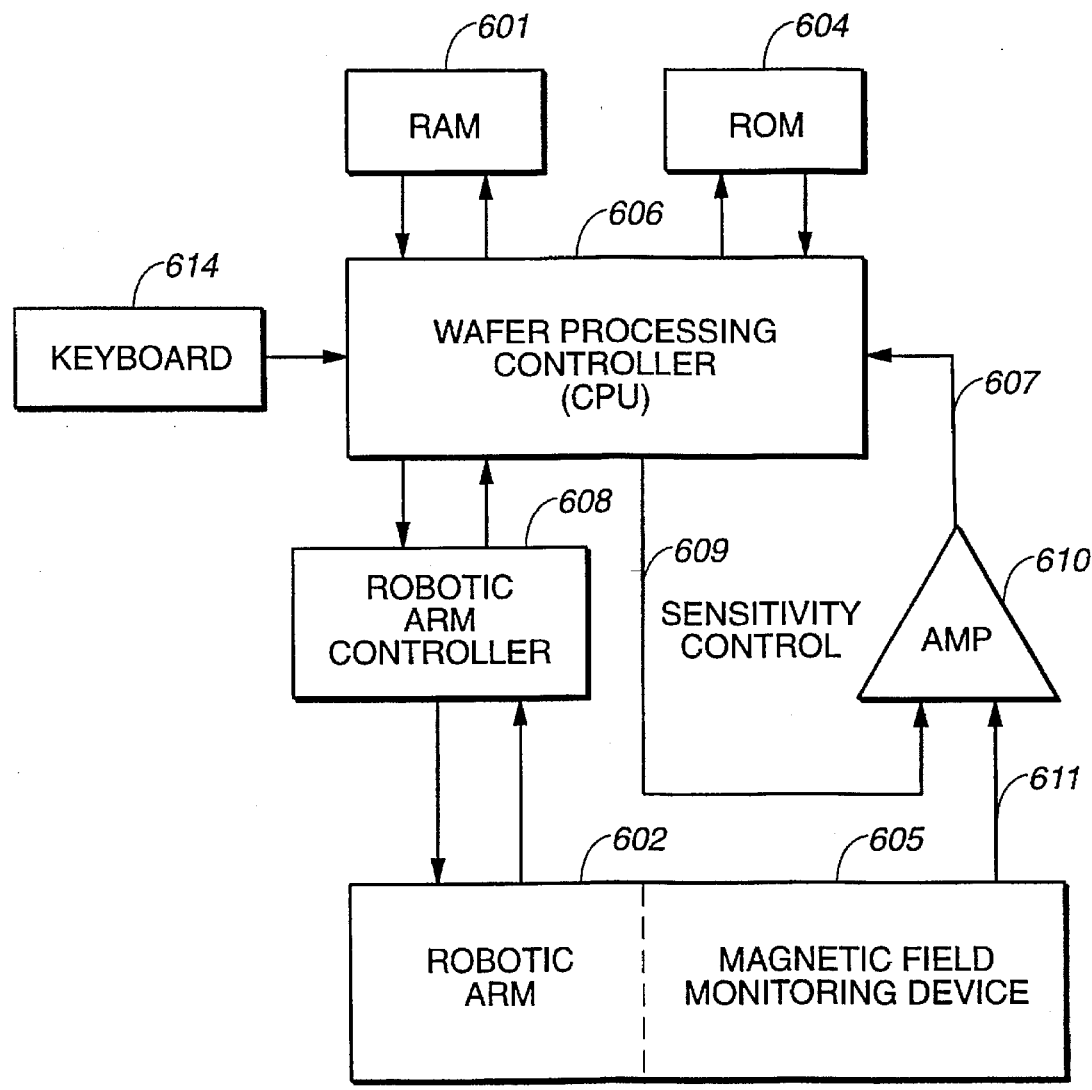
FIG._6

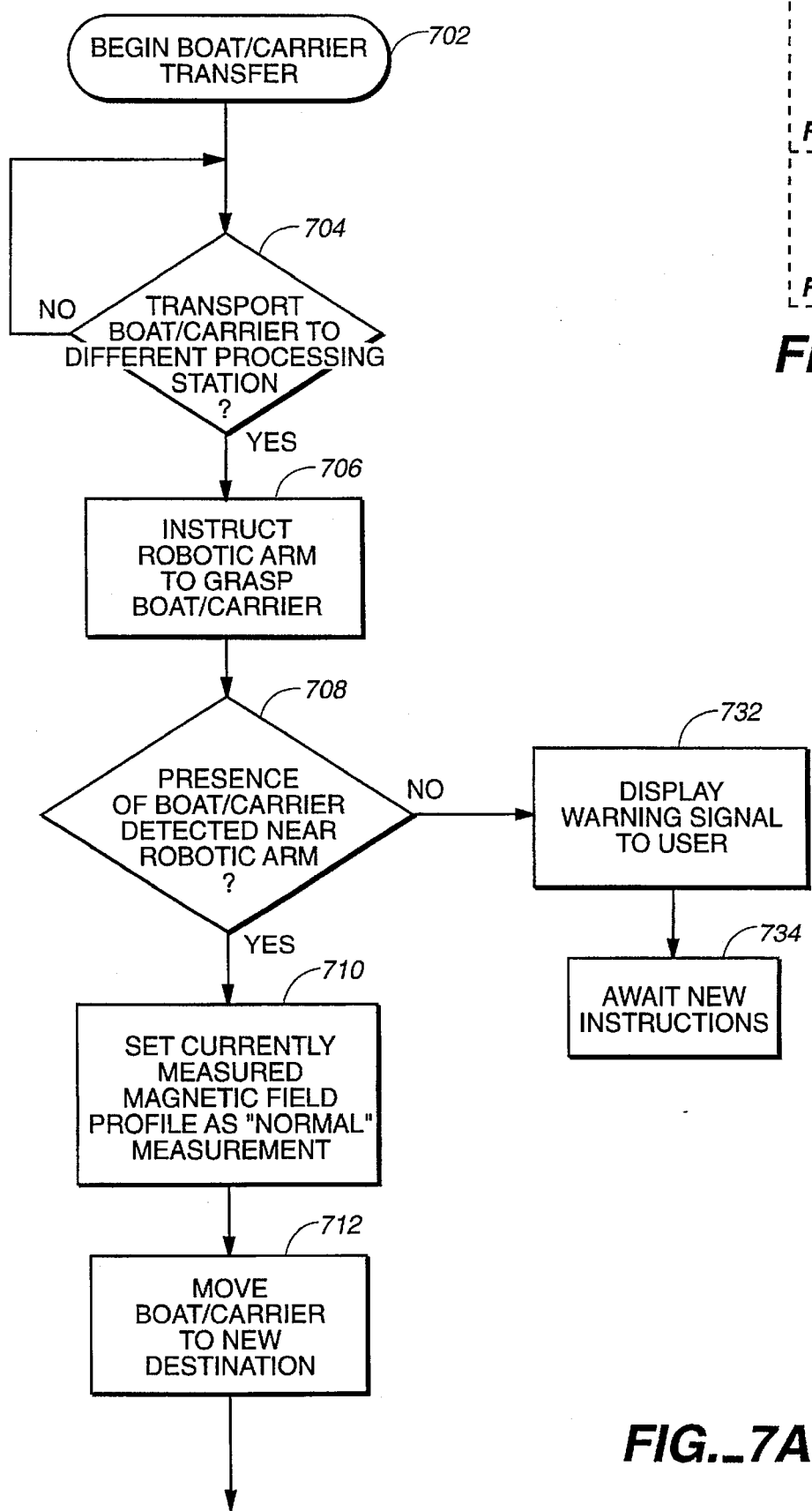
FIG._7
FIG._7A

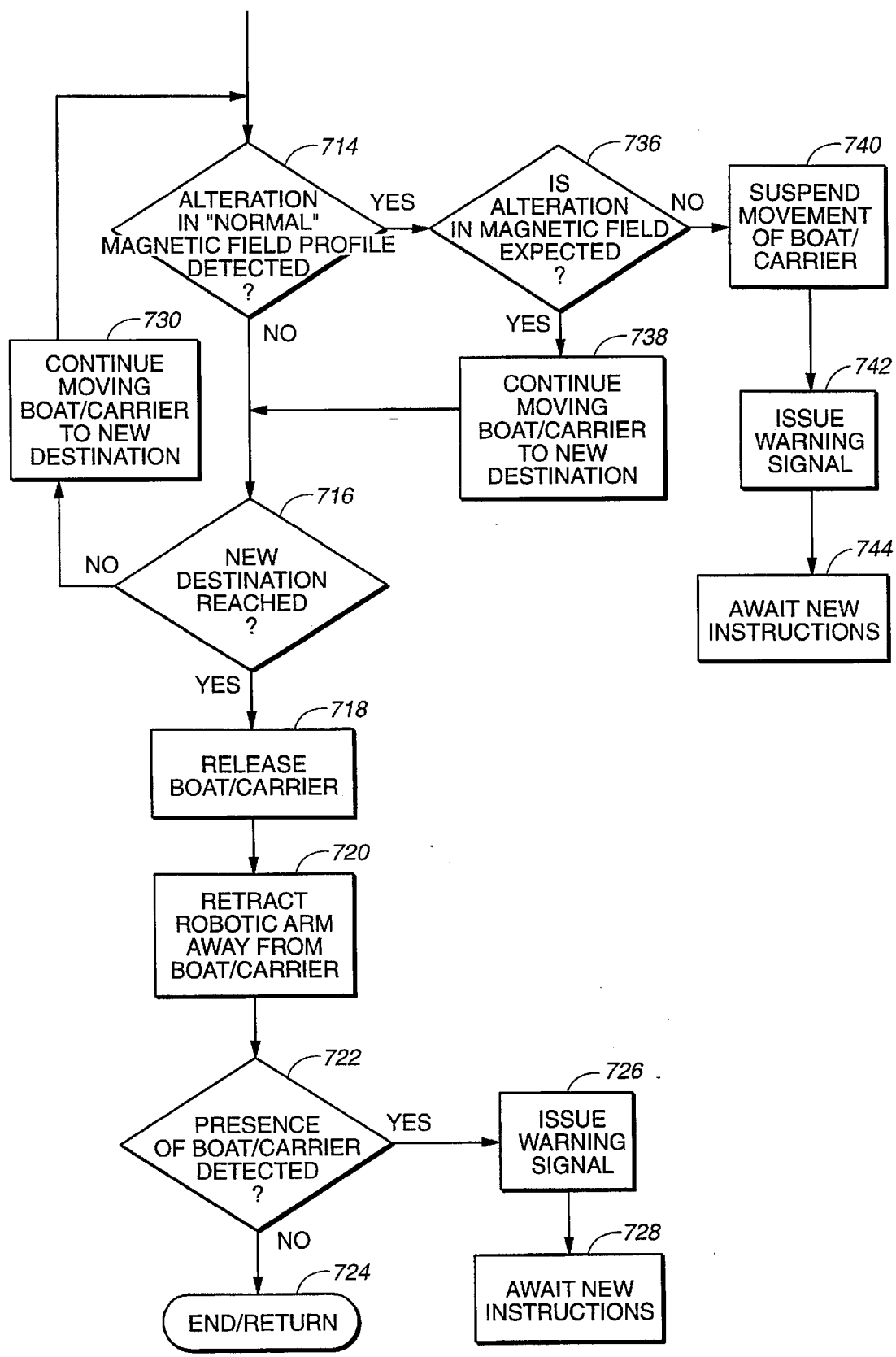
FIG._7B

MAGNETIC SENSING ROBOTICS FOR AUTOMATED SEMICONDUCTOR WAFER PROCESSING SYSTEMS

BACKGROUND OF THE INVENTION

The present invention relates generally to semiconductor wafer processing for integrated circuits, and more particularly to magnetic sensing robotics for collision avoidance in semiconductor wafer processing systems, or other chemical wet stations.

The manufacturer of integrated circuits is becoming a highly automated process. In the semiconductor chip fabrication process it is often necessary to transport cassettes filled with wafers to and from several different processing machines within a particular environment. Depending on the types of chips being manufactured, the number and order of machines will vary. Thus, a fixed transportation system, for example, a continuous belt system, may be impractical. Rather, a preferred mode of wafer cassette transport from one process station to a different process station is through the use of a robotic arm which automatically transports a carrier containing semiconductor wafers from one processing station to a different processing station. On the end of the arm is a "hand". The arm and hand movements are controlled by a servosystem which directs the hand to accomplish any desired pattern of movements. Through programming the robot is directed through various movements in a desired sequence. The use of a sensor input provides the robot with a knowledge of the changes to its environment, i.e. intrusions. Robot control algorithms may monitor sensor states to make decisions concerning the suitability of certain actions.

Semiconductor wafers are processed with wafers held in carriers or boats containing, for example, 25 wafers each. Processing the wafers requires handling and manipulation of the wafer boats for transporting the wafers between process steps and loading wafer boats into process machines. The process machines may produce corrosive fumes and liquids which may contact and attack any handling surface. Additionally, the temperatures of liquids contained within these process machines may range from 20° to 250° C., with the IPA dryer temperatures being the highest. For these reasons, only certain materials may be used for holding and transporting the wafers from one processing station to another.

The wafers are extremely fragile and may be of very high monetary value. For this reason, handling techniques must be very reliable and done in a manner to protect the wafer carriers from being dropped, or forcefully crushed. When handling tasks are given to robots, the robot must be given the ability to sense and judge the safety of its load.

As wafer handling becomes more automated, robots are continually being introduced to manipulate the carriers through the process steps. Robotic handling of wafer carriers is relatively new and suffers from the inability to determine whether the carrier grasped by the robot arm is successful and the inability to detect a collision during motion of wafer carriers. Detecting collisions during motion affords a peripheral benefit of improving the safety of people and adjacent equipment which may be damaged by a non-sensing robot.

Typically, grippers available from robot arm manufacturers are successful in grasping a wafer carrier that is properly presented and which does not exhibit wear or distortion. This works well if the wafer carriers are accurately placed and the grasped carrier remains securely in the gripper. In practice, however, manipulation may be unreliable, limited by carrier distortion and accuracy limitations of the machine delivering the wafer carrier. When delivery deviations occur beyond the acceptance limits of the gripper, it may either miss the wafer carrier entirely, causing the downstream process machine to deal with an error condition, or the gripper may make a partial grip, causing distortion or damage to the wafer carrier, crushed wafers or a dropped wafer carrier.

Similarly, wafer carriers which are worn or otherwise distorted from original design dimensions may cause misgrip problems when a non-sensing gripper is utilized. As above, the results are distortion or damage to the wafer carrier when the carrier slips out during movements. The carrier is also subject to entanglement at the pick-up position and may encounter foreign objects in its path of motion. Also, mis-programming or hardware failure could cause a collision path to be followed. In these cases, the carrier may be wrenched from the gripper or the carrier may be crushed between the gripper and the obstacle.

Although automated processing of semiconductor wafers is usually trouble free, a number of situations may arise in which collisions occur between one carrier and another carrier, with result in destruction of the carrier and/or the plurality of semiconductor wafers. For example, an error in the software controlling the automated process may lead to a collision, damaging the carriers and/or wafers. Alternatively, human error may be introduced which leads to collisions that damage or destroy portions of the carriers/wafers. For example, a user operating the automatic wafer processing system may bypass a particular automated feature, choosing to process the wafers manually at a particular station. If the computer system is not aware of the manual processing occurring at that station, collisions may occur when the automated process subsequently attempts to utilize the station.

One objective of the present invention, therefore, is to provide a collision avoidance technique for automatic wafer processing systems which prevents robotic crashes that destroy processing product such as carriers, boats, and/or semiconductor wafers. Currently, in conventional wafer processing systems, fuses and amplifiers are used to shut down the robotic arm when overcurrent in the robotic arm is detected. One disadvantage to this approach is that this type of safety feature functions only to protect the robot arm itself. Thus, for example, the robotic arm can meet with a relatively large amount of resistance, while not reaching its overcurrent limit, and still continue processing operations. This, in turn, may result in the damaging of wafer carriers and/or the wafers themselves. The damaged equipment not only is expensive to replace, but also results in a major cleanup effort having to be undertaken in order to return the processing station to its "clean room" state. Additionally, such collisions also lead to equipment "down" time, which is undesirable.

Several patents in the past have attempted to incorporate safety features to avoid robotic collisions. For example, U.S. Pat. No. 4,816,732 to Willson discloses a robotic hand for transporting semiconductor wafers. The robotic hand includes impact sensors which detect any amount of impact force encountered which is in excess of the amount tolerated by design. The impact sensors signal the robot mechanism to stop when an undesirable resistive or impact force is encountered. However, the mechanical nature of impact sensors, with tensioning springs, is a very dirty mechanism and not appropriate for cleanroom use. Additionally, such sensors are unable to prevent collisions between the two objects, since it is required that a collision occur before the impact sensors detect any amount of impact force. Furthermore, impact sensors are unable to sense obstacles, or other cassettes in the process sinks, below the surface of process chemicals.

Another type of safety feature proposed for conventional automated wafer processing systems are strain gauges which measure the strain on the robotic arm for detecting collisions. However, this type of safety feature is also problematic. For example, differing cassette loads and different process temperatures produce a very wide and changing load to be sensed by such strain gauges, leading to inaccurate readings. Additionally, robot movements, with their accompanying acceleration and deceleration, would also compound the dynamic loading on the strain gauges making them impractical and unreliable for this purpose. Also, as with impact sensors, the use of strain gauges would not prevent collisions, since it requires a collision to initiate the obstacle detection.

U.S. Pat. No. 4,698,775 to Koch et al. teaches a self-contained mobile reprogrammable automation device for automatic transportation of particular objects from point-to-point within an enclosed environment. The device includes ultrasonic sensors placed about the transport unit to detect objects within a preselected range for collision avoidance and safety purposes. While appropriate for large obstacle sensing, ultrasonics would be inappropriate for wafer cassette detection. The semi-enclosed process equipment would create multiple echoes that would confuse the detection system. Additionally, ultrasonic detection would not detect obstacles, or other cassettes, below the surface of the process chemicals. Furthermore, if used for pausing or stopping robotic carriages or arms, the close proximity of multiple operators would cause many unneeded false stops as people would pass near the equipment.

German Patent No. DE3814582A1 to Thom et al. discloses a collision sensor for use in mobile robots and guide mechanisms of robots, wherein detection of obstacles is accomplished by touching or sensing so that collision destruction of spatially moving process units is prevented. The collision sensor employs the use of a bar magnet and a Hall element which senses the magnetic field of the magnet. The bar magnet is connected to a cylindrical sleeve which extends out from the collision sensor device. When contact is made with the extended sleeve, it shifts the position of the bar magnet within the collision sensor, thereby affecting the magnetic field. This change in the magnetic field is detected by the Hall element, which acts as a trigger or relay switch to stop the motion of the robotic device.

Although the collision sensor described in German Patent No. DE3814582A1 may be useful in preventing collision destruction, it requires that contact be made between the robot and the obstacle before the collision detection circuit is triggered. Such a feature is undesirable, particularly in applications such as semiconductor wafer processing, where even a small amount of contact between the carriers/wafers and obstacles may cause damage. Additionally, because this collision sensor uses moving parts, chemical solvents or other liquids may leak into the interior of the sensor, particularly when the sensor is submerged in a chemical bath, causing destruction of the sensor, and possibly contaminating the chemical bath. Moreover, dimensional constraints of the robotic arm and carrier do not allow for any bulky attachments. Thus, the bulky size of the collision sensor described in German Patent No. DE3814582A1 makes it impractical for use in semiconductor wafer processing systems.

It is, therefore, an object of the present invention to provide a collision detection and avoidance technique for use with automated semiconductor wafer processing systems which overcomes the disadvantages of conventional collision avoidance techniques described above. It is also an object of the present invention to provide a collision avoidance system for use in semiconductor wafer processing systems which is able to detect imminent collisions before they occur, without physical contact being made between the carrier/wafer and the obstacle. Additionally, it is an object of the present invention to provide a collision avoidance technique for use in semiconductor wafer processing systems which is able to detect the presence of other carriers within a particular processing station, even though such carriers may be submersed under liquid and undetectable using conventional collision detection techniques. Further, it is an object of the present invention to provide a low profile, non-bulky collision avoidance system which may be easily incorporated into any conventional semiconductor wafer processing system without taking up extra space in the wafer processing system.

SUMMARY OF THE INVENTION

These and additional objects are accomplished by the various aspects of the present invention wherein, briefly, according to a principle aspect, a collision avoidance technique is provided in an automated semiconductor wafer processing system, wherein a magnet or magnetic strip is incorporated into each boat or carrier used to hold and transport the semiconductor wafers during the IC fabrication process. Additionally, a magnetic field sensing device is incorporated into the robotic arm of the system for sensing the presence of magnetic fields generated by the magnet(s) incorporated into the boats and/or carriers. Using this system, it is possible for the automated system controller to determine whether or not the robotic arm has successfully grasped and/or released a particular boat/carrier. Moreover, after a particular boat/carrier has been grasped by the robotic arm, a profile of the magnetic field surrounding that boat/carrier is able to be determined. As the boat/carrier is then transported from one processing sink to another processing sink, the profile of the magnetic field surrounding the boat/carrier is continually monitored for changes, which may be caused, for example, by the presence of a second boat/carrier (with a magnet embedded therein) within close physical proximity to the boat/carrier being transported. If the changes in the magnetic field profiled are neither anticipated nor expected by the automated process controller, then the movement of the robotic arm is temporarily suspended and a warning signal is issued which indicates to the user of the system that a potential imminent collision is expected. In this way, collisions between one boat/carrier and a second boat/carrier may be anticipated and avoided without relying upon physical contact between the two objects in order to detect collision.

According to a first aspect of the present invention, an automated system for processing of semiconductor wafers is provided, wherein the system comprises a portable housing device for holding and transporting a plurality of semiconductor wafers, and includes a robotic arm releasably engageable with the housing device for transporting the housing device from a first processing station to a second processing station. The robotic arm includes collision detection means for detecting the physical proximity of the housing device to the robotic arm and for detecting and avoiding imminent collisions of an obstacle with the housing device before physical contact is made between the housing device and the obstacle. The collision detection means includes a magnetic field monitoring sensor for monitoring a magnetic field surrounding the housing device. The collision detection means also comprises means for providing a collision avoidance signal when changes in the magnetic field are detected. The automated semiconductor wafer processing system also includes a programmable controller means for controlling physical movements and positions of the robot arm, wherein the controller means includes means responsive to the collision avoidance signal for suspending movement of the robotic arm in order to avoid imminent collisions of obstacles with the housing device.

A second aspect of the present invention is directed to an automated system for processing of semiconductor wafers, wherein the system includes at least one portable housing device for holding and transporting a plurality of semiconductor wafers. The housing device includes at least one magnet hermetically sealed within a portion of the housing device which is used for avoiding imminent collisions between the housing device and other objects.

A third aspect of the present invention is directed to an automated system for processing of semiconductor wafers, wherein the system includes at least one portable carrier for holding and transporting a plurality of semiconductor housing devices, wherein each of the housing devices is used for holding and transporting a plurality of semiconductor wafers during processing of the wafers. The carrier includes at least one magnet hermetically sealed within a portion of the carrier for avoiding imminent collisions between the carrier and another object.

A fourth aspect of the present invention is directed to a method for processing of semiconductor wafers. The method includes the steps of positioning a robotic arm to grasp a housing device, and causing the robotic arm to grasp the housing device; determining the presence of the housing device by sensing the presence of a magnetic field near the robotic arm; measuring characteristics of the magnetic field in order to establish a first magnetic field profile; moving the housing device to a new destination; and continually monitoring the characteristics of the magnetic field during transportation of the housing device, and comparing the monitored characteristics to the first magnetic filed profile in order to detect changes in the characteristics of the magnetic field. If unanticipated changes in the magnetic field profiled are detected, the movement of the robotic arm is temporarily suspended and a warning signal is issued which indicates to the user of the system that a potential imminent collision is expected. In this way, collisions between one boat/carrier and a second boat/carrier may be anticipated and avoided without relying upon physical contact between the two objects in order to detect collision.

Using the technique of the present invention, collisions between one boat/carrier and another boat/carrier are able to be anticipated and avoided before any physical contact is made between the two boats/carriers. Additionally, the technique of the present invention is advantageous in that it provides an additional safety check for determining whether the robotic arm has properly grasped and/or properly released a particular boat/carrier. The technique of the present invention is also able to anticipate imminent collisions between one boat/carrier and another boat/carrier even in the situation where one of the boats/carriers is fully immersed in a liquid processing sink. Furthermore, the technique of the present invention provides a low profile, non-bulky collision avoidance system which may be easily incorporated into any conventional automated semiconductor wafer processing system without taking up extra space.

Additional objects, features, and advantages of the various aspects of the present invention will become apparent from the following description of the preferred embodiments, which description should be taken in conjunction with the accompanying drawings.

BRIEF DESCRIPTION OF THE DRAWINGS

FIG. 1 is a perspective view of one embodiment of a semiconductor wafer processing system 100.

FIG. 2 illustrates a perspective view of the semiconductor wafer processing system 100, showing how the collision avoidance system may be used to detect and avoid collisions between wafer boats 104 and 104'.

FIG. 3 illustrates a perspective view of the robot arm 102 and semiconductor wafer housing device 104 of the present invention, further showing in phantom locations of magnetic field sensing devices and magnets embedded into robot arm 102 and housing device 104, respectively.

FIG. 4 illustrates a perspective view of an alternate embodiment of the present invention, showing an alternate robotic arm 402, and carrier 150 of the present invention used for carrying a plurality of semiconductor wafer boats 104.

FIG. 5 illustrates a cross-sectional view of the embodiment of FIG. 4, taken along the line 5 of FIG. 4, after the robot arm 402 has engaged carrier 150.

FIG. 6 illustrates a block diagram of a portion of the automated semiconductor wafer processing system, showing how the magnetic field monitoring device communicates with other parts of the system.

FIG. 7 illustrates a flow diagram of the technique of the present invention for anticipating and avoiding collisions within an automated semiconductor wafer processing system.

DETAILED DESCRIPTION OF THE PREFERRED EMBODIMENT

FIG. 1 illustrates a perspective view of the automated semiconductor wafer processing system 100 of the present invention. Although the external appearance of system 100 does not appear to be dramatically different from the appearance of convention automated wafer processing stations, system 100 of the present invention includes additional hardware and software which, as described in detail below, anticipates and avoids imminent collisions between selected objects within the system before any physical contact is made between the selected objects.

As shown in FIG. 1, system 100 includes a wafer processing unit 110, which includes a plurality of wafer processing stations, including stations 108a, 108b, and 108c. Each of the plurality of wafer processing stations may be used at different steps during the automated wafer process for fabricating integrated circuit chips.

It is to be noted that the collision avoidance technique of the present invention may be incorporated into any conventional, automated wafer processing system. This includes Semifab (TM) systems and SubMicron (TM) systems. Additionally, this may include any type of wet sink, rinsing, and/or drying system. Moreover, the collision avoidance technique of the present invention may be applied to any automated processing system which employs the use of robotic armatures for transporting and/or handling processed goods from a first physical location to a second physical location.

As a practical example, wafer processing system 110 may be an automatic wet station such as the automated wet station model number SMS #114-01 from SubMicron Systems, Inc., of Allentown Pa. Alternatively, processing system 110 may be an oxide etch station manufactured by Semifab Inc., of Hollister Calif.

In addition to the wafer processing unit 110, the automated wafer processing system 100 of the present invention also includes a robotic arm 102 for holding and/or transporting one or more semiconductor wafers 106 from a first processing station 108a to a second processing station 108b. The plurality of wafers 106 are held in a wafer housing device 104, commonly referred to as a boat. A second type of wafer transporting device, commonly referred to as a carrier or wafer carrier, is shown in FIG. 4 by reference number 150. The carrier 150 typically is used to transport a plurality of boats 104 (each boat containing a plurality of semiconductor wafers) from one processing station to another.

As stated in the Background of the Invention of the present application, processing unit 110, including robotic arm 102, include a number of safety features for preventing damage to the processing equipment. For example, there are two types of conventional sensors which are used to detect boat/carrier presence on the processing station. At the input/output and FR/D queues, boat/carrier presence is detected with fiber optic sensors. The second type of sensor projects two beams of infrared light above the station baths and rinses. Boat/carrier presence is detected when the beams are broken by cassettes entering or exiting a bath or rinse.

A full description of the features and operating instructions of a conventional automated semiconductor wafer processing system is described in the reference, *Automatic Wet Station Operations Manual*, published by SubMicron Systems, Inc., Allentown, Pa., 1993, herein incorporated by reference in its entirety. An additional description of the features and operating instructions of a conventional automated semiconductor wafer processing system is provided in the reference, *Semifab Operating Manual For VLSI "Oxide Etch" Station*, published by Semifab Inc., Hollister Calif., 1988, herein incorporated by reference in its entirety.

Unlike conventional automated semiconductor wafer processing systems, however, system 100 of FIG. 1 includes additional hardware used for detecting and avoiding collisions. As will be described in detail below, boat 104 includes a permanent magnet device 113 for generating a magnetic field around boat 104. In addition, robotic arm 102 includes a magnetic field monitoring device 105 for monitoring the magnetic field generated by magnet 113.

FIG. 2 illustrates a perspective view of a portion of the automated semiconductor processing system of the present invention, showing robotic arm 102 holding a semiconductor wafer housing device 104' above processing sink 108a. Immersed within sink 108a is a second boat 104. Each of the boats 104' and 104 includes at least one magnet 113' and 113, respectively, for generating a magnetic field around each respective boat.

As previously described in the Background of the Invention in the present application, collisions between wafer carrying boats may occur for a variety of reasons, such as, for example, due to computer malfunction, or human error. For purposes of illustrating the collision avoidance technique of the present invention, it will be assumed that, in the example shown in FIG. 2, the presence boat 104 (immersed in sink 108a) is unknown to the central controller overseeing the automated wafer fabrication process. Thus, applying this example to conventional wafer processing systems, as the robotic arm attempted to lower boat 104' into sink 108a, a collision would typically occur (in conventional systems) between boat 104 and boat 104'. Neither infrared beams, nor ultrasonic detectors would be able to detect the presence of the immersed boat 104. Moreover, due to the frailty of the semiconductor wafers themselves, any slight contact from boat 104' with the wafers in boat 104 may damage the wafers, contaminating the chemical bath in sink 108a. This, in turn, would cause the fabrication process to be shut down until the damaged materials can be removed, and the sink cleaned up.

In order to solve the problem in avoiding collisions between semiconductor wafer carrying devices, a permanent magnet 113, 113' is incorporated into the housing of each of boats 104 and 104', which causes a separate magnetic field to be generated around each of the respective boats. Further, a magnetic field sensing device 105 is incorporated into the robotic arm 102 of the system. By monitoring the changes in the magnetic fields (as detected by magnetic field monitoring device 105) as boat 104' moves closer to boat 104, the system can automatically detect the possibility of an imminent collision before actual physical contact is made, and can take steps to prevent the collision from occurring.

The following example provides a more detailed description of the collision avoidance technique of the present invention. Initially, it will be assumed that robotic arm 102 lifted boat 104' from sink 108b, and is transporting it to sink 108a. As arm 102 lifts boat 104' from sink 108b, the only magnetic filed detected by sensor 105 is the field generated by magnet 113'. Although the sensitivity of the magnetic field sensor 105 may be adjusted to be more or less sensitive, it is preferable that the sensitivity be adjusted to a level where the presence of magnetic fields caused by boats in adjacent tanks are not detected by sensor 105 as arm 102 lifts boat 104' out of sink 108b. Moreover, as described below, this sensitivity level may automatically be adjusted by the central processor controller at any time to achieve the desired sensitivity level of sensor 105.

Once the sensitivity level of the magnetic field sensing device 105 has been properly calibrated, the only magnetic field detected by sensor 105 (as boat 104' is lifted out of sink 108b) should be the magnetic field created by magnet 113'. Before the robotic arm 102 begins lateral transportation of boat 104' to sink 108a, the characteristics of the detected magnetic field are gathered so as to establish a "nominal" magnetic field profile of boat 104'. As boat 104' is then transported to sink 108a, the magnetic field sensing device 105 continually monitors the detected magnetic field and compares it against the "nominal" magnetic field profile. Eventually, as boat 104' comes within a predetermined distance to boat 104, the magnetic field generated by magnet 113 will begin to affect the magnetic field generated by magnet 113', causing changes in the detected magnetic field as sensed by sensor 105. The changes in the detected magnetic field indicate that another boat (boat 104) is within close physical proximity to boat 104', and that an imminent collision may occur. In response, the central processing controller temporarily suspends the motion of the robotic arm to prevent the collision from happening. A warning signal may then be issued so as to alert the user of the system problem.

It is to be noted that the predetermined distance required for detection of changes in the detected magnetic field caused by magnet 113 affecting the magnetic field of magnet 113' is a function of the sensitivity of magnetic field sensor 105 and the location of each respective magnet within each boat. These two variables, of course, may be adjusted in order to satisfy particular system requirements. In the example shown in FIG. 2, it is preferable that the magnetic field sensing device 105 be able to detect the magnetic field generated by magnet 113 from a distance of about 60 cm, which is about twice the height of a wafer carrier.

FIG. 3 illustrates a perspective view of the robotic arm 102 and semiconductor wafer housing device 104 of the present invention, further showing, in phantom, various locations of magnetic field sensing devices 103, 105 and magnets 111, 113 which are embedded into the robotic arm 102 and housing device 104, respectively.

One of the fundamental principles of the collision avoidance technique of the present invention is that, by implanting at least one magnetic field sensing device into a portion of the robotic arm and implanting at least one magnet into a portion of the boat 104, the physical presence of the boat 104 near arm 102 may be detected by monitoring the magnetic field surrounding the robotic arm. Once the presence of boat 104 is detected near robotic arm 102, a "nominal" profile of the magnetic field of boat 104 may be created and stored within the memory of the computer system controlling the automated wafer fabrication process. Thereafter, as boat 104 is carried or transported by robotic arm 102, the magnetic field detected by the magnetic field sensing device(s) may be continually monitored for changes which reflect a deviation in the "nominal" magnetic field profile. Such changes, for example, may be the result of a second boat physical being within close physical proximity to the robotic arm and first boat 104.

As illustrated in FIG. 3, each of the semiconductor wafer housing devices 104 and/or carriers (150 of FIG. 4) will include an embedded magnetic device 111, 113 for producing a magnetic field. In this way, as a first boat 104 is carried to within close physical proximity to a second boat, the magnetic field sensor within the robotic arm will detect changes in the magnetic field, which signals to the controller operating the robotic arm that an imminent collision with another boat or carrier is about to occur. In response, before any physical contact is made between the first boat/carrier and the second boat/carrier, the movement of the robotic arm is suspended, thereby suspending transportation of the boat 104 and avoiding the detected imminent collision. Simultaneously, a warning signal may be provided to a user of the system to indicate a problem in the wafer fabrication process.

As shown in FIG. 3, robotic arm 102 includes a distal end portion of the arm 102b for grasping boat 104. At least one magnetic field sensing device 103, 105 may be embedded and hermetically sealed within the material forming robotic arm 102. Typically such material is Teflon (TM).

As shown in FIG. 3, one or more magnetic field monitoring devices may be implanted within the robotic arm 102. The various locations where the magnetic field monitoring device may be located are shown in FIG. 3 at positions 103, 103a, 105, and 105a. Thus, as shown in FIG. 3, a single magnetic field sensing device may be placed at position 105 or position 103, and a second magnetic sensing device may be placed at position 103a and/or 105a.

Alternatively, although not shown, the magnetic field monitoring device or devices may be implanted anywhere within the robotic arm 102 so long as the device is able to detect a magnetic field produced by a magnet within housing device 104 within a distance of up to about 65 cm. Additionally, it is noted that in the case where more than one magnetic field sensor is implanted within the robotic arm, the profile and characteristics of the magnetic field detected may be more accurately determined. Moreover, using two or more magnetic field sensing devices, changes in the magnetic field may be more accurately sensed, thereby improving the sensitivity of the collision avoidance technique of the present invention. In one embodiment of the present invention, for example, the type of magnetic field sensing device used may be a Hall Effect Sensor such as, for example, Hall Effect Sensor Model No. CS-3135, manufactured by Concord Sensors, Inc. of Salisbury, N.H. Alternatively, one or more of the magnetic proximity sensors distributed by Newark Electronics of Chicago, Ill., may be used in conjunction with any compatible type permanent magnet (for the boat/carrier), which, for example, is also distributed by Newark Electronics of Chicago, Ill.

As stated previously in the background of the invention, the temperatures of the liquids contained within the processing sinks may reach up to about 250° C. For this reason, it is preferable to use a magnetic field sensing device and magnet which is able to withstand such temperatures. This may include the use of ceramic magnets, which are able to withstand high temperatures without losing their magnetic properties. Different types of magnetic materials and their temperature ranges are provided in the reference, *The Science and Engineering of Materials*, by Donald R. Ashland, PWS Publishing Corp., 1994 (3rd Edition), ISBN No. 0-534-93423-4, herein incorporated by reference in its entirety.

Additionally, it is an important feature of the collision detection and avoidance technique of the present invention that the hardware (i.e. the magnetic sensor(s) and the magnet (s)) used occupy as little physical space as possible so as not to interfere with the already limited space available to the existing physical objects conventionally used in the wafer fabrication process. For example, wafer carrier dimensions do not allow for any bulky attachments. In this regard, the collision avoidance technique of the present invention is advantageous since both the magnetic sensor and the magnet are imbedded into the housing of the robotic arm and wafer boat, respectively, without taking up extra space on the outside of arm 102 or boat 104.

As shown in FIG. 3, the boat or semiconductor wafer housing device 104 includes at least one permanent magnet for generating a magnetic field which may be detected by the magnetic field sensing device within robotic arm 102. Moreover, one or more magnets 111, 113 may be embedded and hermetically sealed within the material forming boat 104, which is typically made of Teflon (TM).

In one embodiment, as shown in FIG. 3, for example, the position of the magnet may be located near to the area where the boat 104 is grasped by robotic arm 102. Such positions are shown, for example, at 111 and 113 of FIG. 3. Additionally, at least one other magnetic may be embedded within boat 104, as shown at 111a and 113a. It is to be noted, however, that the location of the magnet within boat 104 may be anywhere so long as the magnetic field generated by the magnet may be detected by the magnetic sensing device within arm 102 from a distance of up to about 65 cm away, which is approximately equal to double the height of a wafer carrier (150, FIG. 4). In this regard, it is preferable that the location of the magnet or magnetic device in boat 104 be located near the upper portion of the boat so that the magnet is closer to the magnetic field sensing device located in robotic arm 102. Additionally, as with arm 102, it is preferable that the magnetic field sensing device is located at the distal end portion of the arm (as shown at 405 and 405a), which allows the device to be physically closer to the magnets embedded within carrier 150 and boat 104.

It is to be noted, however, that where the sizes of the semiconductor wafers differ, the size of the housing device 104 and/or carrier 150 (FIG. 4) may differ. Thus, the sensitivity of the magnetic sensing device and physical locations of the embedded sensing device and magnet should preferably be such that the magnetic field of the magnet may be detected from a distance of about double the height of the wafer carrier. Alternatively, these variables may be adjusted so as to comply with and type of standards deemed necessary for proper operation of the automated wafer processing system, including the collision avoidance system described herein.

It is important to note, however, that the magnetic field sensing device within robotic arm 102 should preferably be able to detect changes in the magnetic field of a boat or carrier within its grasp, wherein the magnetic field changes are caused by at least one magnet in a second boat or carrier within close physical proximity to the first boat or carrier.

Since a typical quartz carrier is about 30 cm in height, it follows that the sensitivity of the magnet should be able to sense a magnetic field which is about double this distance, accounting for the length of two boats or carriers, the first being within the grasp of the robotic arm, and the second being submerged within a processing sink, for example. In the example of FIG. 2, this total distance is approximately 65 cm, but may vary depending upon the size of the boat or carrier, and upon the depth of the sink 108a.

FIG. 4 illustrates a perspective view of an alternate embodiment of the collision avoidance system of the present invention, showing an alternate robotic arm 402, and carrier 150, which is used for carrying a plurality of semiconductor wafer boats 104. The robotic arm 402 shown in FIG. 4 is intended for use with carrier 150, typically referred to as a quartz carrier.

As shown in FIG. 4, robotic arm 402 may include one or more magnetic field sensing devices 405 and 405a which are hermetically sealed within a portion of the arm. The carrier 150 may include a magnet 407 which is similar to magnet 103 and which is embedded and hermetically sealed into an upper portion of the carrier 150b to allow the magnet to be closer to magnetic field sensing device located within arm 402.

Alternatively, carrier 150 may include a rod magnet or magnetic strip 409 which is preferably hermetically sealed and embedded into the handle portion of the carrier as shown in FIG. 4. In another alternate embodiment, both magnet 409 and magnet 407 may be incorporated into carrier 150. It is also to be noted that, in addition to the magnets embedded into carrier 150, boat 104 will also contain one or more magnets as described previously, even while being transported on carrier 150.

FIG. 5 shows a cross-sectional view of the embodiment of FIG. 4, taken along the line 5 of FIG. 4, after the robot arm 402 has engaged carrier 150. From this illustration it can be seen that magnetic field sensing device 105 is completely encased and hermetically sealed within the material forming robotic arm 402. If an additional magnetic field sensing device 105a is used, it too will be encased and hermetically sealed within robotic arm 402. By hermetically sealing the sensing devices within the robotic arm, each of the magnetic field sensing devices are protected against both heat and the corrosive elements which are caused primarily by the chemicals within the processing sinks of station 110.

As shown in FIG. 6, for example, each of the magnetic field sensing devices 105, 105a may be electrically connected to the computer processor 606 controlling the automated wafer fabrication process via electrical wires (not shown), which may also be embedded into the robotic arm 402, travelling up through the robotic arm and to a remote location where the electrical signals may then be processed. Other means for supplying the electrical signals to and from the magnetic field sensing device and the controller 606 may also be used which are known to one ordinarily skilled in the art.

Additionally, as shown in FIG. 5, each of the magnets 407 and 409 within carrier 150 are completely encased and hermetically sealed within the material forming carrier 150. It is to be noted that the same is also true for the magnets 103, 105 embedded within boat 104.

FIG. 6 shows a block diagram of a portion of the automated semiconductor wafer processing system, showing how the various signals for collision avoidance communicate with other parts of the system.

At the heart of the system is the controller 606 which controls the automated operations of the semiconductor wafer processing system. The central controller 606 communicates with a robotic arm controller 608 which controls the movement and position of the robotic arm 602. A magnetic field monitoring device 605, such as that described previously, is incorporated into robotic arm 602. The magnetic field monitoring device provides at least one signal 611 which describes the characteristics and profile of any monitored magnetic field. Signal 611, is, in turn, fed into an amplifier 610 along with a sensitivity control signal 609 to allow the sensitivity of the magnetic field monitoring device signal to be adjusted either manually or automatically. The output of amplifier 610 produces signal 607 which contains the characteristics and profile information of the monitored magnetic field(s) and has been adjusted for a particular sensitivity, depending upon the particular needs of the wafer processing system.

It is to be noted that the adjustment of the sensitivity of the signal produced by the magnetic field monitoring device may be accomplished either manually, or may be accomplished automatically. For example, a user of the system may use keyboard 614 to input a particular desired sensitivity of signal 607. Alternatively, the central controller 606 may be used to automatically adjust the sensitivity of signal 607 to bring it within a predetermined range, or to suit a particular application.

For example, if the magnetic field detected by monitoring device 605 is very weak, signal 611 will be a weak signal which may need to be amplified to a predetermined level in order for the central controller 606 to make a proper comparison as to whether a collision is imminent. The controller may then automatically choose to increase the signal strength of signal 611 by causing it to be amplified using sensitivity control signal 609. The resulting amplified signal 607 may then be properly analyzed by the central controller 606.

Signal 607 will contain the characteristics of the detected magnetic field, forming a particular magnetic field profile. As described in greater detail below, this profile may be stored within the memory of the controller system such as, for example, within memory RAM 601. In this way, changes in the magnetic field profile may be detected by comparing the original profile stored within RAM 601 to the profile currently detected by the monitoring device 605.

Alternatively, although not shown, the amplifier circuit may include a relay which would energize if the signal from the amplifier reached a preset level. The energized relay, in turn, would shut off power to the robot arm. If the magnetic field sensor in the robotic arm detected the presence of a magnetic strip in another boat, power would be shut off to the robotic arm as described earlier. Motion of the robotic arm would then cease, thereby preventing one boat from crashing into another boat of wafers. The exact design and placement of the magnetic sensors may vary depending upon the type of robotic arm used.

Additional magnetic field profiles may also be stored within ROM 604, to be recalled and compared to the currently detected magnetic field profile as measured by monitoring device 605. Thus, for example, several types of magnetic field profiles, corresponding to various types of situational collisions may be pre-stored within ROM 604 and used by the central processing unit 606 to evaluate any changes in the monitored magnetic field profile. In this way, the central processing unit 606 may be able to determine what type of collision, if any, is about to occur, and may then alert the user to the specific problem.

It is to be noted that were more than one magnetic field sensor is used, each of the signals from each of the sensors may be averaged to form an "average" magnetic field profile. Alternatively, each of the signals may be analyzed independently in the manner described above.

FIG. 7 illustrates a flow diagram of the technique of the present invention for anticipating and avoiding collisions within an automated semiconductor wafer processing system. The process begins by instructing the robotic arm to transport a boat or carrier from one processing station or sink to a second processing station or sink. Thus, at 704, the central processing unit asks whether the boat/carrier is to be transported to a different processing station. If the answer is yes, the robotic arm is instructed to grasp the boat/carrier. At 708, the CPU inquires whether the presence of the boat or carrier is detected near the robotic arm, as it should be. To determine this, the presence of a magnetic field should be detected of sufficient strength by the magnetic field monitoring device embedded within the robotic arm. A profile previously stored within ROM 604 (showing the profile of a successfully grasped boat or carrier) may be used as a comparison tool to determine whether the currently measured magnetic field profile is similar to that stored within ROM 604. If there is no detectable magnetic field, or if the magnetic field profile is substantially different from that expected, it is determined that there is no presence of a boat or carrier near the robotic arm, in which case a warning signal is displayed to the user, and the system awaits new instructions, thereby avoiding any potential collision.

Assuming that the presence of a boat or carrier is detected near the robotic arm, other safety sensors within the system may check to make sure that the arm has properly grasped the boat or carrier. The profile of the currently measured magnetic field is then established as the "normal" measurement, and may be stored within RAM 601. At 712 the robotic arm is instructed to move the boat or carrier to its new destination.

While the robotic arm is moving the boat or carrier to its new destination, the magnetic field currently detected by the magnetic field monitoring device is continually monitored and compared against the "normal" profile for any changes or deviations. A detected change in the "normal" magnetic field profile indicates the presence of another boat or carrier or other magnetic object within proximity to the boat or carrier being transported, alerting the controller to the possibility of an imminent collision.

At 736, the central controller determines whether the alteration in the magnetic field is expected. Thus, for example, referring to FIG. 1, if boat 104 where transported from station 108a to station 108c, passing over 108b, and a second boat or carrier was located within station 108b, a change in the measured magnetic field profile may be detected as the robotic arm passed over station 108b. However, this change in the magnetic field should normally be anticipated by the controller, since the controller knows that in passing from station 108a to station 108c, it must pass over station 108b. Further, the controller should know that station 108b contains a boat or carrier therein. Thus, in such a situation, the alteration in the magnetic field profile is expected. For additional safety, the newly measured magnetic field profile may be compared to an appropriate profile stored within the ROM 604 to verify that the situation which the controller is detecting is one in which a first boat or carrier is passing over a second boat or carrier immersed in a processing sink.

Assuming that the alteration in the magnetic field profile is anticipated or expected, the robotic arm will continue moving the boat or carrier to its new destination. However, if the alteration or change in the magnetic field profile is not expected, this indicates the possibility of an imminent collision, and the movement of the transported boat or carrier is suspended. At that point, a warning signal is issued to the user, and the system awaits new instructions.

If no alteration in the "normal" magnetic field profile is detected, or if an alteration in the profile has been detected, but has been expected or is anticipated, the robotic arm continues to move the boat or carrier to its new destination. The central controller, working in conjunction with the robotic arm controller 608, continuously inquires whether the new destination for the boat or carrier has been reached. This may include placing the boat or carrier within a particular processing station or sink. If the new destination of the carrier has not been reached completely, the robotic arm continues to move the boat or carrier to its final destination. In addition, the central processing unit continually analyzes the currently measured magnetic field profile in order to detect any changes or abnormalities in the magnetic field as compared against the "normal" magnetic field profile. Any unanticipated changes in the detected magnetic field indicate an imminent collision.

Once the carrier has been placed at its final destination, the boat or carrier is then released. The robotic arm is then instructed to retract itself away from the boat or carrier. In order to ensure that the boat or carrier did not accidentally hook itself onto the robotic arm, the central processing unit inquires whether the presence of the boat or carrier is detected near the robotic arm. The strength of the measured magnetic field should indicate the proximity of the boat or carrier to the robotic arm. If the presence of the boat or carrier is detected as being near the robotic arm, a warning signal is issued by the system, and the system awaits new instructions. If, however, the presence of the boat or carrier is not detected as being within close physical proximity to the robotic arm, the end of the boat/carrier transfer process has been reached, and the central processing unit may then continue on to other tasks.

Tens of thousands of dollars in product have been scrapped due to robotic related boat crashes at the etch and strip sinks in automated semiconductor wafer processing systems. The present invention is able to prevent boat crashes and is more sensitive in anticipating and detecting robotic malfunctions and techniques of the prior art.

The technique of the present invention provides a very clean advancement for collision avoidance. Moreover, imminent collisions may be detected and avoided without requiring the occurrence of a collision or physical contact between the objects, thus saving valuable product and avoiding equipment downtime. Additionally, the collision avoidance system of the present invention offers a low profile solution which can easily be incorporated into existing automated wafer processing systems without adding bulk to the system or taking up extra space.

Additionally, it is to be noted that the technique of the present invention may also be used as an emergency safety system for preventing injury to humans and/or other objects which may be in the path of the robotic arm. In such an application, permanent type magnets may be incorporated into or otherwise attached to any object or human operating within the vicinity of the automated wafer processing system. For example, one or more magnets may be incorporated into doors which provide access to specific processing stations. The position of the magnet and relative strength of its magnetic field may be chosen so that, if the door were to fail to open properly, the controller would sense a change in the detected magnetic field as the robotic arm neared the unopened door and would halt the movement of the robotic arm, thereby preventing injury.

In another example, humans working in the wafer processing facility could wear wrist bands with a permanent type magnet imbedded therein. Such wrist bands could then be employed to temporarily suspend the movement of the robotic arm in emergency situations by the user holding out his or her arm near the robotic arm. Such a use could be applied in emergency situations where, for example, physical injury to the user and/or other objects may result if the robot arm is not halted, and the user is otherwise unable to halt the robot arm using conventional proceedures.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

It is claimed:

1. An automated system for processing of semiconductor wafers through a plurality of wafer fabrication processing stations for manufacturing integrated circuits, the plurality of processing stations including a first and a second processing station, said system comprising:

a portable housing device for holding and transporting a plurality of semiconductor wafers during processing of said wafers;

a robotic arm releasably engagable with said housing device for transporting said housing device and said wafers from a first processing station to a second processing station, said robotic arm including collision detection means for detecting the physical proximity of said housing device to said robotic arm and for detecting and avoiding imminent collisions of an obstacle with said housing device before physical contact is made between said housing device and said obstacle, wherein said collision detection means includes magnetic field monitoring means for monitoring a magnetic field surrounding said housing device and for providing a collision avoidance signal when predetermined changes in said magnetic field are detected; and a programmable controller means in communication with said robotic arm for controlling physical movements and positions of said robot arm, said controller means including means responsive to said collision avoidance signal for suspending movement of said robotic arm in order to avoid said detected imminent collision of said housing device with said obstacle.

2. The system of claim 1 wherein said robotic arm includes a magnetic field proximity sensor hermetically sealed within a portion of said robotic arm.

3. The system of claim 1 wherein said housing device includes at least one magnet hermetically sealed within a portion of said housing device.

4. The system of claim 3 wherein each of said objects includes at least one magnet hermetically sealed within a portion of said object.

5. The system of claim 1 wherein said magnetic field monitoring means further provides a proximity signal for indicating whether said housing is within close physical proximity to said robotic arm, and wherein said controller means is responsive to said proximity signal for controlling physical movements and positions of said robot arm.

6. The system of claim 1 further including a carrier for holding and transporting a plurality of semiconductor housing devices, wherein said carrier includes at least one magnet hermetically sealed with a portion of said carrier.

7. The system of claim 1 wherein said magnetic field monitoring means has a sensitivity range of about 61 centimeters.

8. The system of claim 1 wherein said magnetic field monitoring means includes means for adjusting a sensitivity of said monitoring means to a desired sensitivity range.

9. The system of claim 8 wherein said sensitivity range is from about 10 centimeters to about 65 centimeters.

10. The system of claim 5 wherein said magnetic field monitoring means further provides a second proximity signal for indicating whether said carrier is within close physical proximity to said robotic arm, and wherein said controller means is responsive to said second proximity signal for controlling physical movements and positions of said robot arm.

11. An automated system for processing of semiconductor wafers through a plurality of wafer fabrication processing stations for manufacturing integrated circuits, said system comprising at least one portable housing device for holding and transporting a plurality of semiconductor wafers during processing of said wafers, wherein said at least one housing device includes at least one magnet hermetically sealed within a portion of said housing for avoiding imminent collisions between said housing device and another object.

12. An automated system for processing of semiconductor wafers through a plurality of wafer fabrication processing stations for manufacturing integrated circuits, said system comprising at least one portable a carrier for holding and transporting a plurality of semiconductor housing devices, each of said housing devices holding and transporting a plurality of semiconductor wafers during processing of said wafers, wherein said at least one carrier includes at least one magnet hermetically sealed within a portion of said carrier for avoiding imminent collisions between said carrier and another object.

13. A method for processing of semiconductor wafers through a plurality of wafer fabrication processing stations for manufacturing integrated circuits, said system including a robotic arm having a magnetic field monitoring device, a housing device for carrying and transporting a plurality of semiconductor wafers, and a controller for automatically controlling movements and positions of the robotic arm, said method comprising the steps of:

(a) positioning said robotic arm to grasp said housing device, and thereafter grasping said housing device;

(b) determining the presence of said housing device by sensing the presence of a magnetic field near said robotic arm;

(c) measuring characteristics of said magnetic field in order to establish a first magnetic field profile;

(d) moving said housing device to a new destination; and (e) continually monitoring characteristics of said magnetic field during transportation of said housing device, and comparing said monitored characteristics to said first profile in order to detect changes in the characteristics of said magnetic field.

14. The method of claim 13 further including the step of suspending motion of said robotic arm if non-anticipated changes are detected in said monitored magnetic field.

15. The method of claim 14 further including the step of issuing a collision avoidance warning signal to a user of said system when non-anticipated changes are detected in said monitored magnetic field.

16. The method of claim 13 further including the step of automatically adjusting a sensitivity of said magnetic field monitoring device to a predetermined range during a specific wafer processing task.

* * * * *

UNITED STATES PATENT AND TRADEMARK OFFICE
CERTIFICATE OF CORRECTION

PATENT NO. : 5,668,452
DATED : September 16, 1997
INVENTOR(S) : Villarreal et al.

It is certified that error appears in the above-indentified patent and that said Letters Patent is hereby corrected as shown below:

In Column 9, line 25:
   replace "example, may be the result of a second boat physical being" with:

--example, may be the result of a second boat or carrier being --

Signed and Sealed this

Tenth Day of March, 1998

Attest:

BRUCE LEHMAN

Attesting Officer     Commissioner of Patents and Trademarks